(12) United States Patent
Nakada

(10) Patent No.: US 10,897,001 B2
(45) Date of Patent: Jan. 19, 2021

(54) THERMOELECTRIC CONVERSION MODULE

(71) Applicant: MITSUBISHI MATERIALS CORPORATION, Tokyo (JP)

(72) Inventor: Yoshinobu Nakada, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/086,397

(22) PCT Filed: Mar. 22, 2017

(86) PCT No.: PCT/JP2017/011376
§ 371 (c)(1),
(2) Date: Sep. 19, 2018

(87) PCT Pub. No.: WO2017/164217
PCT Pub. Date: Sep. 28, 2017

(65) Prior Publication Data
US 2019/0103536 A1    Apr. 4, 2019

(30) Foreign Application Priority Data

Mar. 24, 2016 (JP) .................................. 2016-060866
Feb. 24, 2017 (JP) .................................. 2017-033837

(51) Int. Cl.
*H01L 35/32* (2006.01)
*H01L 35/30* (2006.01)
(Continued)

(52) U.S. Cl.
CPC .............. *H01L 35/32* (2013.01); *F25B 21/02* (2013.01); *H01L 35/08* (2013.01); *H01L 35/22* (2013.01); *H01L 35/30* (2013.01); *H01L 35/34* (2013.01)

(58) Field of Classification Search
CPC ......... H01L 35/30; H01L 35/34; H01L 35/22; H01L 35/32; H01L 35/08
See application file for complete search history.

(56) References Cited

U.S. PATENT DOCUMENTS 3,859,143 A * 1/1975 Krebs ..................... H01L 35/16
                                                                    136/205
4,497,973 A   2/1985 Heath et al.
(Continued)

FOREIGN PATENT DOCUMENTS

JP    01-295684 A    11/1989
JP    07-335945 A    12/1995
(Continued)

OTHER PUBLICATIONS

JP 11-087786 A online machine translation, translated on Oct. 8, 2019.*
(Continued)

*Primary Examiner* — Golam Mowla
(74) *Attorney, Agent, or Firm* — Locke Lord LLP

(57) ABSTRACT

Provided is a thermoelectric conversion module, in which n-type thermoelectric conversion elements and p-type thermoelectric conversion elements are formed of materials having different thermal expansion coefficients, one surface sides of the n-type thermoelectric conversion elements and one surface sides of the p-type thermoelectric conversion elements are aligned and joined on one surface side of an insulating substrate, and thermal conductive members are formed on other surface sides of the n-type thermoelectric conversion elements and other surface side of the p-type thermoelectric conversion elements, respectively.

11 Claims, 4 Drawing Sheets

(51) Int. Cl.
 *H01L 35/34* (2006.01)
 *H01L 35/08* (2006.01)
 *H01L 35/22* (2006.01)
 *F25B 21/02* (2006.01)

(56) References Cited

U.S. PATENT DOCUMENTS

| | | | | |
|---|---|---|---|---|
| 4,946,511 | A * | 8/1990 | Shiloh | H01L 35/10 |
| | | | | 136/211 |
| 6,002,081 | A * | 12/1999 | Sakuragi | H01L 35/32 |
| | | | | 136/203 |
| 7,999,172 | B2 * | 8/2011 | Yu | H01L 35/32 |
| | | | | 136/205 |
| 8,895,833 | B2 * | 11/2014 | Ukita | H01L 35/06 |
| | | | | 136/205 |
| 2003/0184941 | A1 * | 10/2003 | Maeda | G06F 1/206 |
| | | | | 361/103 |
| 2004/0107986 | A1 * | 6/2004 | Neilson | G01K 1/18 |
| | | | | 136/204 |
| 2004/0118129 | A1 * | 6/2004 | Chrysler | F25B 21/02 |
| | | | | 62/3.2 |
| 2006/0118160 | A1 * | 6/2006 | Funahashi | H01L 35/08 |
| | | | | 136/236.1 |
| 2006/0137732 | A1 * | 6/2006 | Farahani | H01L 25/16 |
| | | | | 136/201 |
| 2008/0023057 | A1 * | 1/2008 | Nakajima | H01L 35/08 |
| | | | | 136/201 |
| 2010/0218796 | A1 | 9/2010 | Hiroyama | |
| 2015/0287901 | A1 | 10/2015 | Lorimer et al. | |

FOREIGN PATENT DOCUMENTS

| | | |
|---|---|---|
| JP | 10-093148 A | 4/1998 |
| JP | 11-087786 A | 3/1999 |
| JP | 2000-286459 A | 10/2000 |
| JP | 2006-310506 A | 11/2006 |
| JP | 2008-182092 A | 8/2008 |
| JP | 2009-099686 A | 5/2009 |
| JP | 2011-249742 A | 12/2011 |
| JP | 2012-533972 A | 12/2012 |
| JP | 2014-071936 A | 4/2014 |

OTHER PUBLICATIONS

Supplementary European Search Report dated Sep. 2, 2019, issued for European Patent Application No. 17770257.8.
International Search Report dated Jun. 13, 2017, issued for PCT/JP2017/011376 and English translation thereof.

* cited by examiner

THERMOELECTRIC CONVERSION MODULE

TECHNICAL FIELD

The present invention relates to a thermoelectric conversion module in which a plurality of thermoelectric conversion elements are electrically connected to each other.

Priority is claimed on Japanese Patent Application No. 2016-060866, filed on Mar. 24, 2016 and Japanese Patent Application No. 2017-033837, filed on Feb. 24, 2017, the contents of which are incorporated herein by reference.

BACKGROUND ART

A thermoelectric conversion element is an electronic element that can convert heat and electricity into each other using the Seebeck effect, the Peltier effect, or the like. The Seebeck effect is an effect in which thermal energy is converted into electric energy, and is a phenomenon in which an electromotive force is generated in a case where a difference in temperature is generated between opposite ends of a thermoelectric conversion material. This electromotive force is determined depending on characteristics of the thermoelectric conversion material. Recently, the development of thermoelectric power generation using this effect has been proposed (for example, refer to PTL 1).

On the other hand, the Peltier effect is an effect in which electric energy is converted into thermal energy, and is a phenomenon in which a difference in temperature is generated between opposite ends of a thermoelectric conversion material in a case where electrodes or the like are formed on the opposite ends of the thermoelectric conversion material to generate a difference in potential between the electrodes. In particular, an element having the effect is called a Peltier element and uses cooling or temperature control of a precision instrument or a small-sized refrigerator (for example, refer to PTL 2).

As the thermoelectric conversion module having a configuration in which a plurality of thermoelectric conversion elements are electrically connected to each other, in general, a uni-leg type thermoelectric conversion module in which thermoelectric conversion elements having the same semiconductor type are connected to each other, and a pi ($\pi$)-type thermoelectric conversion module in which thermoelectric conversion elements having different semiconductor types, that is, an n-type thermoelectric conversion element and a p-type thermoelectric conversion element are alternately connected to each other are known.

Among these, the pi ($\pi$)-type thermoelectric conversion module can be made to have a simpler electric connection configuration than the uni-leg type thermoelectric conversion module, and can efficiently perform thermoelectric conversion by p-n junction.

In the related art, the $\pi$-type thermoelectric conversion module has a configuration in which each of one surface side and other surface side of n-type thermoelectric conversion elements and p-type thermoelectric conversion elements connected to one other through an electrode plate or the like is joined to one insulating plate.

CITATION LIST

Patent Literature

[PTL 1] Published Japanese Translation No. 2012-533972 of the PCT International Publication

[PTL 2] Japanese Unexamined Patent Application, First Publication No. 2011-249742

SUMMARY OF INVENTION

Technical Problem

In the pi ($\pi$)-type thermoelectric conversion module, in a case where thermoelectric conversion materials having different compositions are used, there is a difference in thermal expansion coefficient between the n-type thermoelectric conversion element and the p-type thermoelectric conversion element. Therefore, in the related art, in the configuration in which each of the one surface side and the other surface side of the n-type thermoelectric conversion elements and the p-type thermoelectric conversion elements is joined to one insulating plate, due to the difference in thermal expansion coefficient between the n-type thermoelectric conversion element and the p-type thermoelectric conversion element, defects such as the peeling of any one of thermoelectric conversion elements from the insulating plate or the cracking of the element may occur.

The present invention has been made in consideration of the above-described circumstances, and an object thereof is to provide a thermoelectric conversion module including a combination of an n-type thermoelectric conversion element and a p-type thermoelectric conversion element that are formed using thermoelectric conversion materials having different thermal expansion coefficients, respectively, in which the peeling of the thermoelectric conversion element from a substrate or the cracking of the thermoelectric conversion element can be prevented.

Solution to Problem

According to one aspect of the present invention for achieving the object, there is provided a thermoelectric conversion module including: n-type thermoelectric conversion elements and p-type thermoelectric conversion elements, each of which is alternately connected in series through an electrode plate, wherein the n-type thermoelectric conversion elements and the p-type thermoelectric conversion elements are formed of materials having different thermal expansion coefficients, one surface side of each of the n-type thermoelectric conversion elements and one surface side of each of the p-type thermoelectric conversion elements are aligned and joined on one surface side of an insulating substrate, and a thermal conductive member is formed independently on each of other surface sides of the n-type thermoelectric conversion elements and on each of other surface sides of the p-type thermoelectric conversion elements.

During the operation (thermoelectric conversion) of the thermoelectric conversion module, the n-type thermoelectric conversion material and the p-type thermoelectric conversion material that are formed of materials having different thermal expansion coefficients thermally expand to have different sizes due to heat on the high-temperature heat side. For example, in a case where the n-type thermoelectric conversion material has a higher thermal expansion coefficient than the p-type thermoelectric conversion material, the n-type thermoelectric conversion material expands to be larger than the p-type thermoelectric conversion material.

However, in the thermoelectric conversion module having the above-described configuration, only the one surface sides of the n-type thermoelectric conversion element and the p-type thermoelectric conversion element are joined to the common insulating substrate, and the thermal conductive members are independently formed on the other surface sides of the n-type thermoelectric conversion element and the p-type thermoelectric conversion element, respectively. As a result, the n-type thermoelectric conversion element and the p-type thermoelectric conversion element do not interfere with each other. Therefore, the thermal conductive member does not peel off from the n-type thermoelectric conversion element or the p-type thermoelectric conversion element, or cracking does not occur in the element. The n-type thermoelectric conversion element is allowed to expand to be larger than the p-type thermoelectric conversion element such that an end portion of the thermal conductive member formed on the n-type thermoelectric conversion element can protrude further than a tip of the thermal conductive member formed on the p-type thermoelectric conversion element.

In the thermoelectric conversion module according to the aspect of the present invention, it is preferable that a thermal conductive insulating layer is disposed between the each of other sides of the n-type thermoelectric conversion elements and each of the thermal conductive members; and between the each of other sides of the p-type thermoelectric conversion elements and each of the thermal conductive members, respectively.

In this case, insulating properties are secured between the other surface sides of the n-type thermoelectric conversion element and the p-type thermoelectric conversion element and the thermal conductive member. Therefore, current leakage caused by contact between the thermal conductive member and another metal member can be prevented, and a thermoelectric conversion module having high safety can be realized.

In the thermoelectric conversion module according to the aspect of the present invention, it is preferable that a heat shielding member is further disposed between one of the n-type thermoelectric conversion elements and one of the p-type thermoelectric conversion elements adjacent to each other.

In this case, heat transfer from the one surface side to the other surface side is suppressed by the heat shielding member, a difference in temperature between the one surface side and the other surface side of the n-type thermoelectric conversion element and the p-type thermoelectric conversion element can be maintained, and the power generation efficiency can be improved.

In the thermoelectric conversion module according to the aspect of the present invention, it is preferable that the heat shielding member is a heat shielding plate including a plurality of openings that are formed so as to allow penetration of the n-type thermoelectric conversion elements and the p-type thermoelectric conversion elements.

In this case, radiation heat transfer from the one surface side to the other surface side is suppressed by the heat shielding plate, a difference in temperature between the one surface side and the other surface side of the n-type thermoelectric conversion element and the p-type thermoelectric conversion element can be maintained, and the power generation efficiency can be improved.

In the thermoelectric conversion module according to the aspect of the present invention, it is preferable that a protective cover is formed so as to surround other surface side of the insulating substrate and a circumference of a region in which the n-type thermoelectric conversion elements and the p-type thermoelectric conversion elements are arranged.

In this case, the protective cover prevents the corrosion or corruption of the thermoelectric conversion module, and prevents a decrease in the thermoelectric conversion efficiency of the thermoelectric conversion module.

In the thermoelectric conversion module according to the aspect of the present invention, it is preferable that the thermal conductive member is formed of a material having a thermal conductivity of 10 W/(mK) or more.

In this case, the thermal conductivity of the thermal conductive member is relatively high at 10 W/(mK) or more, and thus can effectively dissipate heat and absorb heat.

In the thermoelectric conversion module according to the aspect of the present invention, it is preferable that tip portions of the thermal conductive members that are formed on the other surface sides of the n-type thermoelectric conversion elements and the other surface sides of the p-type thermoelectric conversion elements are dipped in a coolant.

In the thermoelectric conversion module having the above-described configuration, the tip portions of the thermal conductive members formed on the other surface side of the n-type thermoelectric conversion element and the other surface side of the p-type thermoelectric conversion element are dipped in the coolant. As a result, a difference in temperature between the one surface side and the other surface side of the n-type thermoelectric conversion element and the p-type thermoelectric conversion element can be maintained, and the power generation efficiency can be improved.

In the thermoelectric conversion module according to the aspect of the present invention, it is preferable that a metal layer is formed on a surface of the insulating substrate opposite to a surface where the n-type thermoelectric conversion elements and the p-type thermoelectric conversion elements are joined to each other.

In the thermoelectric conversion module having the above-described configuration, the metal layer is formed on the surface of the insulating substrate opposite to the surface where the n-type thermoelectric conversion element and the p-type thermoelectric conversion element are joined to each other. Therefore, a heat source can be disposed through the metal layer, thermal shock on the insulating substrate can be suppressed, and the service life of the insulating substrate can be extended.

Advantageous Effects of Invention

In the thermoelectric conversion module according to the present invention including a combination of an n-type thermoelectric conversion element and a p-type thermoelectric conversion element that are formed using thermoelectric conversion materials having different thermal expansion coefficients, respectively, the peeling of the thermoelectric conversion element from a substrate or the cracking of the thermoelectric conversion element can be prevented.

DESCRIPTION OF EMBODIMENTS

Figure 1:
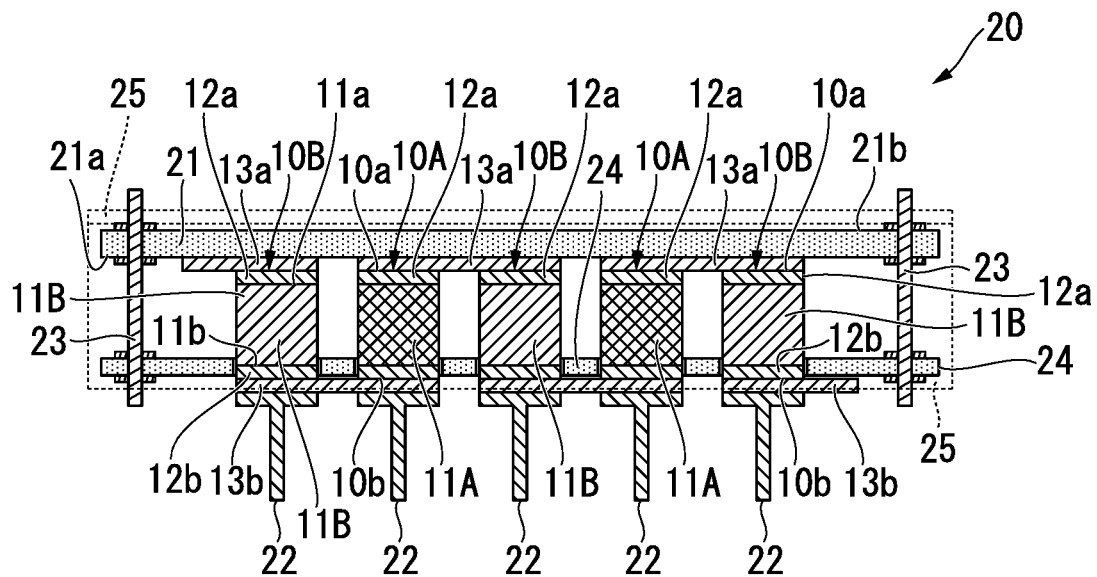
FIG. 1 is a cross-sectional view illustrating a thermoelectric conversion module according to a first embodiment when seen from a side surface thereof.

Hereinafter, a thermoelectric conversion module according to the present invention will be described with reference to the drawings. Each embodiment described below will be described in detail in order to easily understand the scope of the present invention, and does not limit the present invention unless specified otherwise. In addition, in the drawings used in the following description, main parts are enlarged and illustrated in some cases for convenience of description in order to easily understand characteristics of the present invention, and a dimensional ratio between components is not necessarily the same as the actual one.

(Thermoelectric Conversion Module: First Embodiment)

FIG. 1 is a cross-sectional view illustrating a thermoelectric conversion module according to a first embodiment when seen from a side surface thereof.

The thermoelectric conversion module 20 according to the first embodiment is a pi ($\pi$)-type thermoelectric conversion module in which thermoelectric conversion materials having different semiconductor types, for example, p-type and n-type thermoelectric conversion materials are connected in series.

The thermoelectric conversion module 20 includes: an insulating substrate 21; and an n-type thermoelectric conversion element 10A and a p-type thermoelectric conversion element 10B that alternately arranged on one surface side 21a of the insulating substrate 21.

The insulating substrate 21 is a single common substrate to which all the n-type thermoelectric conversion elements 10A and the p-type thermoelectric conversion elements 10B are joined. The insulating substrate 21 can be formed of a material having excellent insulating properties and thermal conductivity, for example, a plate material formed of silicon carbide, silicon nitride, aluminum nitride, aluminum oxide, SIALON, or the like.

As the insulating substrate 21, a composite substrate in which a conductive metal material is formed as a base material and an insulating layer such as a resin film or a ceramic thin film is formed around the base material can also be used.

The insulating substrate 21 is a medium that applies heat to first surfaces 11a of thermoelectric conversion materials 11A and 11B or absorbs heat. The thermal conductivity of the insulating substrate 21 is, for example, preferably 20 W/(mK) or more. The thermal conductivity of the insulating substrate 21 is more preferably 30 W/(mK) or more and still more preferably 40 W/(mK) or more.

The thermoelectric conversion element 10A is joined to the insulating substrate 21 on the one surface side 10a, and metalized layers 12a and 12b are formed on the first surface 11a and a second surface 11b of the n-type thermoelectric conversion material 11A, respectively.

Specific examples of the n-type thermoelectric conversion material 11A include a thermoelectric conversion material that is manufactured using a method including: adding antimony (Sb) as a dopant to magnesium silicide ($Mg_2Si$); sintering the mixture to obtain a thermoelectric conversion material; and cutting the thermoelectric conversion material in a desired shape. During sintering, 0.5 mol % to 13.0 mol % of a silicon oxide such as $SiO_2$ can be added. By adding the silicon oxide, the hardness or of the thermoelectric conversion material or the power generation efficiency increases.

As the n-type thermoelectric conversion material 11A according to the embodiment, a magnesium sintered material obtained by adding 0.5 at % of antimony to $Mg_2Si$ is used. In the embodiment, the n-type thermoelectric conversion material has a high carrier density due to the addition of antimony as a pentavalent donor. The thermal expansion coefficient of the n-type thermoelectric conversion material 11A according to the embodiment at 500° C. is, for example, about $12.5 \times 10^{-6}$/K to $17.5 \times 10^{-6}$/K.

As a magnesium compound constituting the n-type thermoelectric conversion material 11A, in addition to $Mg_2Si$, a compound obtained by another element to $Mg_2Si$, for example, $Mg_2Si_xGe_{1-x}$, or $Mg_2Si_xSn_{1-x}$ can also be used.

In addition, as the donor of the n-type thermoelectric conversion material 11A, in addition to antimony, for example, bismuth, aluminum, phosphorus, or arsenic can be used.

The thermoelectric conversion element 10B is joined to the insulating substrate 21 on the one surface side 10a, and metalized layers 12a and 12b are formed on the first surface 11a and a second surface 11b of the p-type thermoelectric conversion material 11B, respectively.

Specific examples of the p-type thermoelectric conversion material 11B include a thermoelectric conversion material that is manufactured using a method including: sintering $MnSi_{1.73}$, $Mn_{34.6}W_{1.8}Si_{63.6}$, $Mn_{30.4}Re_6Si_{63.6}$, or the like to obtain a thermoelectric conversion material; and cutting the thermoelectric conversion material in a desired shape. In the embodiment, a manganese sintered material formed of $MnSi_{1.73}$ is used as the p-type thermoelectric conversion material 11B is used, and the thermal expansion coefficient thereof at 500° C. is, for example, about $10.0 \times 10^{-6}$/K to $11.5 \times 10^{-6}$/K.

The metalized layers 12a and 12b intermediate layers that join electrode plates 13a and 13b to the n-type thermoelectric conversion material 11A and the p-type thermoelectric conversion material 11B. For example, nickel, silver, cobalt, tungsten, molybdenum, or nonwoven fabric formed of metallic fibers thereof is used.

In the embodiment, nickel is used as the metalized layers 12a and 12b. The metalized layers 12a and 12b can be formed by sintering, plating, electrodeposition, or the like.

The n-type thermoelectric conversion element 10A and the p-type thermoelectric conversion element 10B disposed adjacent to each other are electrically connected in series through the electrode plates 13a and 13b. Specifically, the metalized layer 12a of the n-type thermoelectric conversion material 11A and the metalized layer 12a of the p-type thermoelectric conversion material 11B disposed adjacent thereto are connected to each other through the electrode plate 13a. The metalized layer 12b of the p-type thermoelectric conversion material 11B and the metalized layer 12b of the n-type thermoelectric conversion material 11A disposed adjacent thereto are connected to each other through the electrode plate 13b.

The electrode plates 13a and 13b are formed of a metal material having excellent conductivity, for example, a plate material of copper, aluminum, or the like. In the embodiment, a rolled plate of aluminum is used. In addition, the metalized layers 12a and 12b and the electrode plates 13a and 13b can be joined to each other using a Ag brazing material, a Ag paste, or the like.

A plurality of n-type thermoelectric conversion elements 10A and p-type thermoelectric conversion elements 10B arranged this way are electrically connected in series. That is, in the pi ($\pi$)-type thermoelectric conversion module 20, the n-type thermoelectric conversion element 10A and the p-type thermoelectric conversion element 10B are alternately and repeatedly connected in series.

FIG. 1 shows only the n-type thermoelectric conversion elements 10A and the p-type thermoelectric conversion elements 10B corresponding to one line on the front side. Actually, however, the n-type thermoelectric conversion elements 10A and the p-type thermoelectric conversion elements 10B corresponding to a plurality of lines in the depth direction of the drawing are also alternately arranged.

With this configuration, by generating a difference in temperature between the one surface side 10a and the other surface side 10b of the n-type thermoelectric conversion element 10A and the p-type thermoelectric conversion element 10B, the thermoelectric conversion module 20 can be used as a Seebeck element that generates a difference in potential between the electrode plate 13a and the electrode plate 13b.

In addition, for example, by applying a voltage between the electrode plate 13a side and the electrode plate 13b, the thermoelectric conversion module 20 can be used as a Peltier element that generates a difference in temperature between the one surface side 10a and the other surface side 10b of the n-type thermoelectric conversion element 10A and the p-type thermoelectric conversion element 10B. For example, by causing a current to flow between the electrode plate 13a side and the electrode plate 13b, the one surface side 10a or the other surface side 10b of the n-type thermoelectric conversion element 10A and the p-type thermoelectric conversion element 10B can be cooled or heated.

On the other surface side 10b of each of the n-type thermoelectric conversion element 10A and the p-type thermoelectric conversion element 10B, a thermal conductive member 22 is formed. That is, the thermal conductive members 22 are formed on the n-type thermoelectric conversion element 10A and the p-type thermoelectric conversion element 10B, respectively.

As a material of the thermal conductive member 22, a material having excellent insulating properties and thermal conductivity, for example, a rod material or a plate material of silicon carbide, silicon nitride, aluminum nitride, aluminum oxide, or the like, or a rod material or a plate material having a structure in which unevenness is provided on a surface in order to increase the surface area can be used. The thermal conductive member 22 is a medium that applies heat to second surfaces 11b of thermoelectric conversion materials 11A and 11B or absorbs heat. That is, the thermal conductive member 22 is a member for heat dissipation or heat absorption. In a case where the thermal conductive member 22 is formed of a material having excellent insulating properties and thermal conductivity, the thermal conductivity of the thermal conductive member 22 is, for example, preferably 10 W/(mK) or more. The thermal conductivity of the thermal conductive member 22 is more preferably 20 W/(mK) or more and still more preferably 30 W/(mK) or more.

In addition, as a material the thermal conductive member 22, a metal material having excellent thermal conductivity, for example, a rod material or a plate material of aluminum or an aluminum alloy, magnesium or a magnesium alloy, copper or a copper alloy, or the like, or a rod material or a plate material having a structure in which unevenness is provided on a surface in order to increase the surface area can also be used. In a case where the thermal conductive member 22 is formed of a metal material having excellent thermal conductivity, the thermal conductivity of the thermal conductive member 22 is, for example, preferably 200 W/(mK) or more and more preferably 400 W/(mK) or more.

Further, a heat shielding member 24 is disposed between the n-type thermoelectric conversion element 10A and the p-type thermoelectric conversion element 10B adjacent to each other. Specifically, the heat shielding member 24 is formed of a heat shielding plate including a plurality of openings that are formed so as to allow penetration of the n-type thermoelectric conversion element 10A and the p-type thermoelectric conversion element 10B. On the other surface side 10b of the n-type thermoelectric conversion element 10A and the p-type thermoelectric conversion element 10B, the heat shielding member 24 is formed so as to cover a gap between the n-type thermoelectric conversion element 10A and the p-type thermoelectric conversion element 10B.

The heat shielding member 24 propagates radiation heat from the one surface side 10a of the n-type thermoelectric conversion element 10A and the p-type thermoelectric conversion element 10B to the other surface side 10b thereof so as to reduce a difference in temperature between the one surface side 10a and the other surface side 10b and to prevent a decrease in thermoelectric conversion efficiency.

Alternatively, the heat shielding member 24 can also function as a member that prevents propagation of radiation heat from the other surface side 10b of the n-type thermoelectric conversion element 10A and the p-type thermoelectric conversion element 10B to the one surface side 10a thereof.

The heat shielding member 24 is a member having low thermal conductivity and insulating properties, for example, a heat insulating material formed of alumina, a SIALON plate, or rock wool, or a heat insulating material formed of fibers such as alumina or silica.

Alternatively, as the heat shielding member 24, a plate or a foil formed of a metal such as stainless steel, aluminum, copper, or steel that reflects infrared light can also be used. In this case, it is necessary to provide the openings such that this plate or the foil formed of the metal is not in contact with the thermoelectric conversion element 10A or 10B.

The heat shielding member 24 and the insulating substrate 21 are integrated such that the n-type thermoelectric conversion element 10A and the p-type thermoelectric conversion element 10B are interposed between peripheral portions thereof by a fastening member 23 such as a thread or a screw.

In addition, a protective cover 25 is formed so as to surround a region in which the other surface side 21b of the insulating substrate, the n-type thermoelectric conversion element 10A, and the p-type thermoelectric conversion element 10B are arranged. The protective cover 25 prevents the corrosion or corruption of the thermoelectric conversion module 20, and prevents a decrease in the thermoelectric conversion efficiency of the thermoelectric conversion module 20.

The protective cover 25 is formed of, for example, a plate material of stainless steel, steel, or aluminum.

The effects of the thermoelectric conversion module 20 according to the embodiment having the above-described configuration will be described.

In a case where the thermoelectric conversion module 20 is used as, for example, a Seebeck element, a difference in temperature is generated between the one surface side 10a and the other surface side 10b of the n-type thermoelectric conversion element 10A and the p-type thermoelectric conversion element 10B through the insulating substrate 21 and the thermal conductive member 22 formed on each of the n-type thermoelectric conversion element 10A and the p-type thermoelectric conversion element 10B. As a result, a difference in potential can be generated between the electrode plate 13a the electrode plate 13b.

Figure 2:
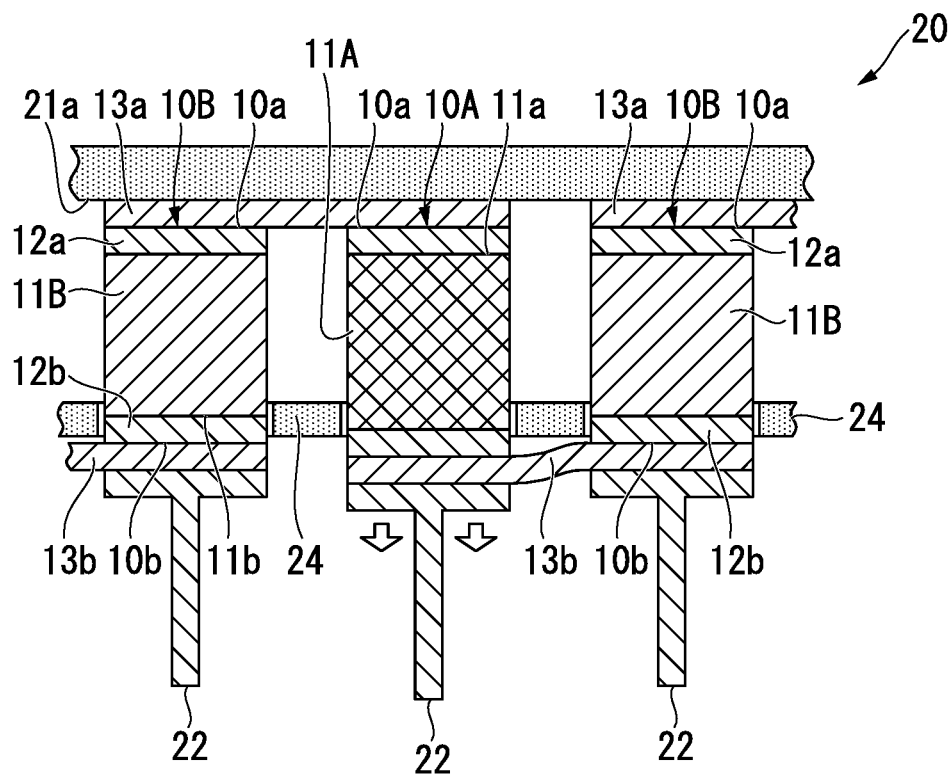
FIG. 2 is an enlarged cross-sectional view of main parts illustrating a state where the thermoelectric conversion module according to the first embodiment operates.

FIG. 2 is an enlarged cross-sectional view of main parts illustrating a state where the thermoelectric conversion module according to the first embodiment operates.

During the operation (thermoelectric conversion) of the thermoelectric conversion module 20, the n-type thermoelectric conversion material 11A and the p-type thermoelectric conversion material 11B that are formed of materials having different thermal expansion coefficients thermally expand to have different sizes due to heat on the high-temperature heat side, for example, the one surface side 10a.

In the embodiment, the n-type thermoelectric conversion material 11A has a higher thermal expansion coefficient than the p-type thermoelectric conversion material 11B. Therefore, for example, the n-type thermoelectric conversion material 11A expands to be larger than the p-type thermoelectric conversion material 11B along the thickness direction.

However, only the one surface side 10a of the n-type thermoelectric conversion element 10A and the p-type thermoelectric conversion element 10B is joined to the insulating substrate 21 as the common substrate through the electrode plate 13a, and the thermal conductive members 22 are independently formed on the other surface sides 10b of the n-type thermoelectric conversion element 10A and the p-type thermoelectric conversion element 10B, respectively. Therefore, the metalized layers 12a and 12b, or the electrode plates 13a and 13b do not peel off from the n-type thermoelectric conversion element 10A or the p-type thermoelectric conversion element 10B. In addition, cracking does not occur in the thermoelectric conversion elements 10A or 10B. The n-type thermoelectric conversion element 10A is allowed to expand to be larger than the p-type thermoelectric conversion element 10B such that a tip of the thermal conductive member 22 formed on the n-type thermoelectric conversion element 10A can protrude further than a tip of the thermal conductive member 22 formed on the p-type thermoelectric conversion element 10B.

Due to the difference in thermal expansion coefficient between the n-type thermoelectric conversion element 10A and the p-type thermoelectric conversion element 10B, the electrode plate 13b is bent to some extent. However, the electrode plate 13b is formed of a plate material or a foil of copper, aluminum, or the like having excellent malleability or ductility, or an electrode in which multiple layers of foils are laminated, and thus does not peel off from the n-type thermoelectric conversion element 10A or the p-type thermoelectric conversion element 10B even in a case where the electrode plate 13b is bent.

As described above, even in a case where the thermoelectric conversion module 20 according to the embodiment is formed of a combination of the n-type thermoelectric conversion element 10A and the p-type thermoelectric conversion element 10B that are formed using the n-type thermoelectric conversion material 11A and the p-type thermoelectric conversion material 11B having different thermal expansion coefficients, respectively, the peeling of the thermoelectric conversion element 10A or 10B from the insulating substrate 21 or the thermal conductive member 22 can be prevented.

(Thermoelectric Conversion Module: Second Embodiment)

Figure 3:
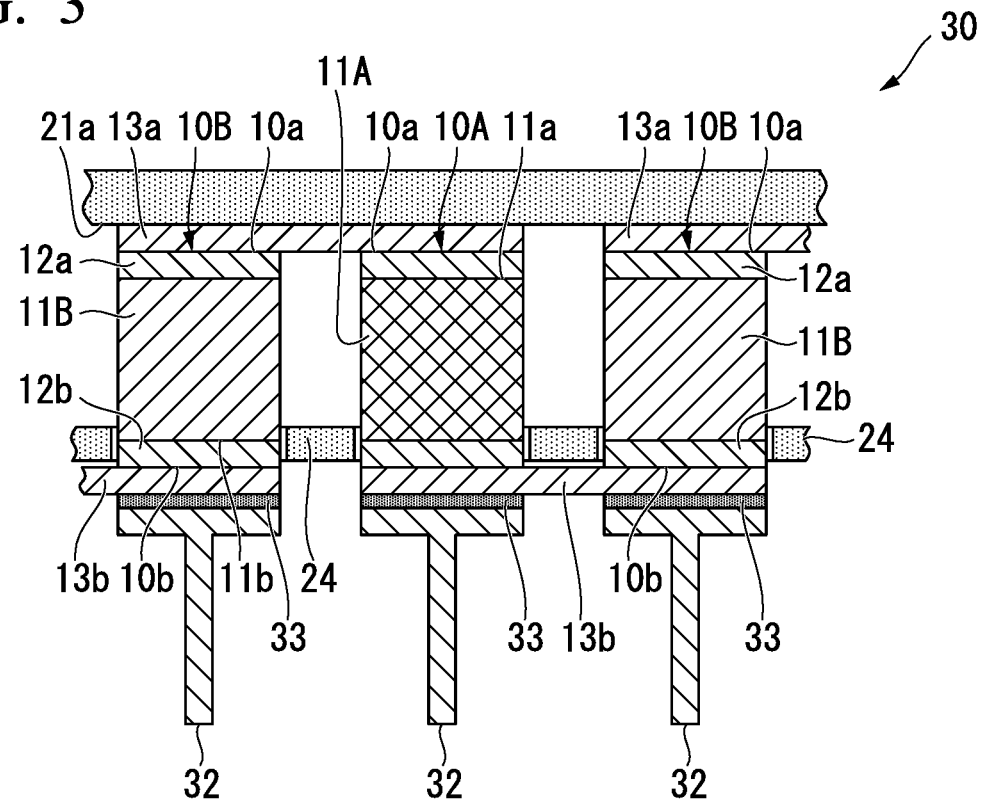
FIG. 3 is an enlarged cross-sectional view of main parts of a thermoelectric conversion module according to a second embodiment.

FIG. 3 is an enlarged cross-sectional view of main parts of a thermoelectric conversion module according to a second embodiment.

In the thermoelectric conversion module 30 according to the second embodiment, thermal conductive insulating layers 33 are formed between the other surface side 10b of the n-type thermoelectric conversion element 10A and the thermal conductive member 32 and between the other surface side 10b of the p-type thermoelectric conversion element 10B and the thermal conductive member 32, respectively.

The thermal conductive insulating layer 33 can be formed of, for example, silicon carbide, silicon nitride, aluminum nitride, or aluminum oxide. By forming the thermal conductive insulating layer 33 adjacent to each of the thermal conductive members 32, insulating properties can be secured between the thermal conductive member 32 and the electrode plate 13b. As a result, in a case where the thermal conductive member 32 is formed using a metal having excellent thermal conductivity, current leakage caused by contact between the thermal conductive member 32 and another metal member can be prevented, and a thermoelectric conversion module having high safety can be realized.

(Thermoelectric Conversion Module: Third Embodiment)

Figure 4:
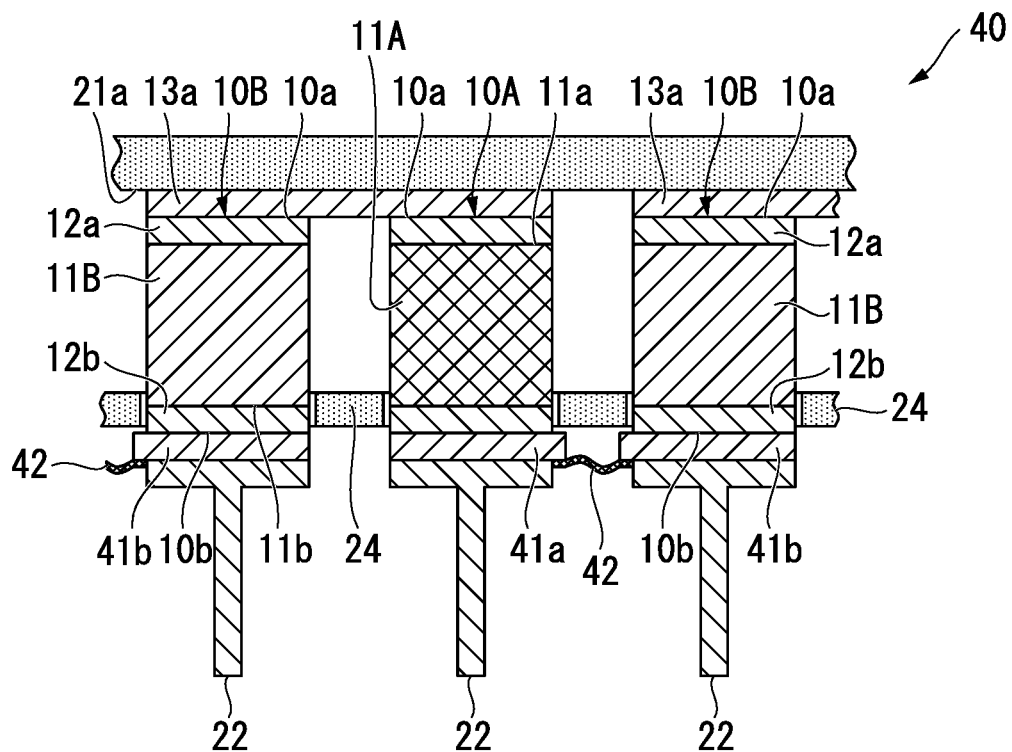
FIG. 4 is an enlarged cross-sectional view of main parts of a thermoelectric conversion module according to a third embodiment.

FIG. 4 is an enlarged cross-sectional view of main parts of a thermoelectric conversion module according to a third embodiment.

In the thermoelectric conversion module 40 according to the third embodiment, electrode plates 41a and 41b are formed on the other surface sides 10b of the n-type thermoelectric conversion element 10A and the p-type thermoelectric conversion element 10B, respectively, and the electrode plate 41a and the electrode plate 41b are connected through a flexible lead wire 42.

As a result, even in a case where a displacement between the other surface sides 10b of the n-type thermoelectric conversion element 10A and the p-type thermoelectric conversion element 10B is large due to a difference in thermal expansion coefficient between the n-type thermoelectric conversion material 11A and the p-type thermoelectric conversion material 11B, conductivity can be secured between the other surface side 10b of the n-type thermoelectric conversion element 10A and the other surface side 10b of the p-type thermoelectric conversion element 10B.

Hereinabove, some embodiments of the present invention have been described. However, the embodiments are exemplary and are not intended to limit the scope of the present invention. The embodiments can be realized in other various forms, and various omissions, substitutions, and changes can be made within a range not departing from the scope of the present invention. The embodiments and modifications thereof are included in the scope and spirit of the present invention, and are included in the claims and the equivalents thereof.

Figure 5:
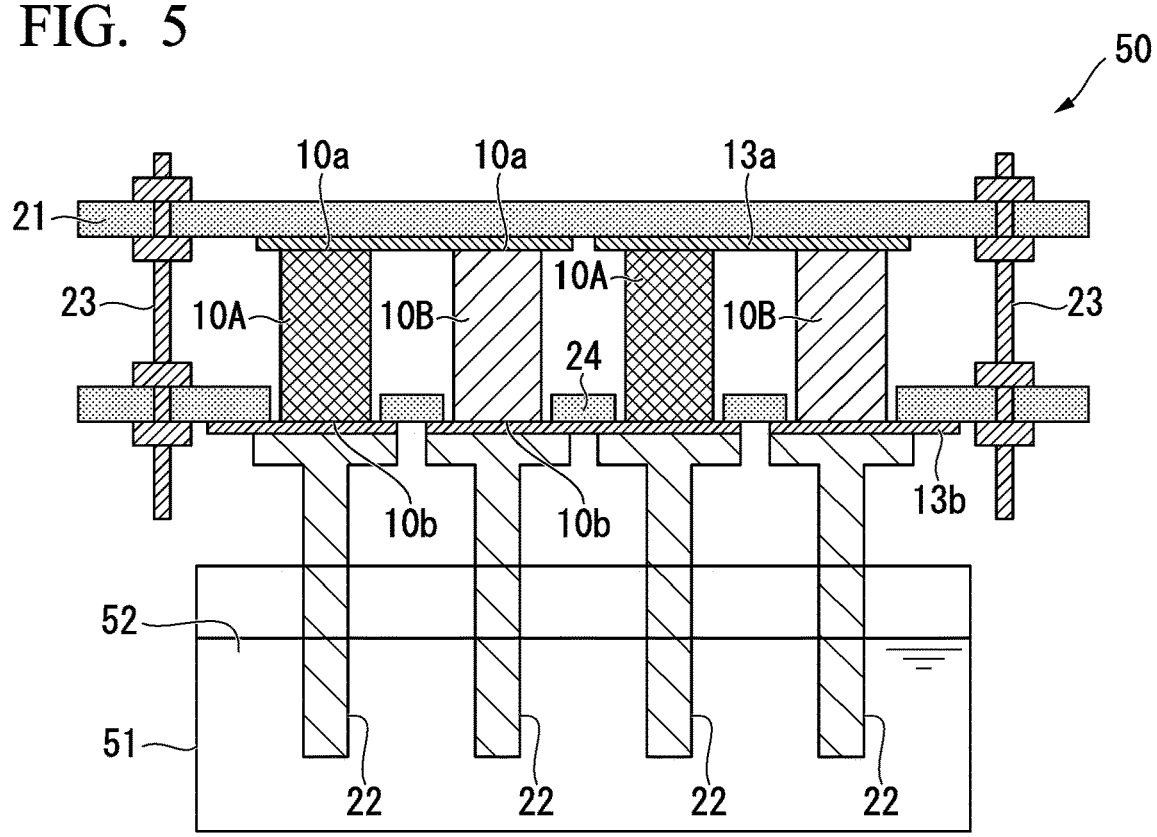
FIG. 5 is a cross-sectional view illustrating a thermoelectric conversion module according to another embodiment of the present invention when seen from a side surface thereof.

For example, as in the case of a thermoelectric conversion module 50 shown in FIG. 5, tips of the thermal conductive members 22 formed on the other surface sides 10b of the n-type thermoelectric conversion element 10A and the p-type thermoelectric conversion element 10B may be configured to be dipped in a coolant 52 stored in a storage tank 51. With this configuration, a difference in temperature between the one surface side 10a and the other surface side 10b of the n-type thermoelectric conversion element 10A and the p-type thermoelectric conversion element 10B can be maintained, and the power generation efficiency can be improved.

Figure 6:
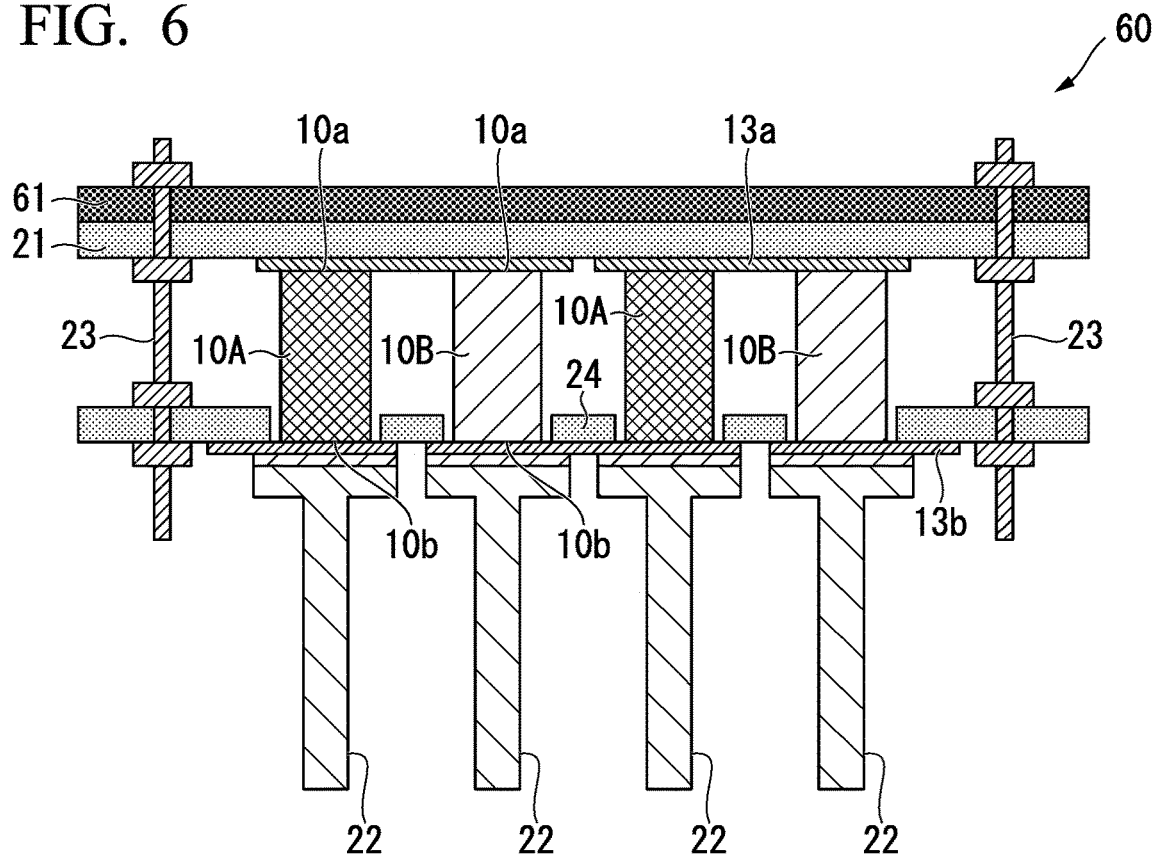
FIG. 6 is a cross-sectional view illustrating a thermoelectric conversion module according to still other embodiment of the present invention when seen from a side surface thereof.

In addition, as in the case of a thermoelectric conversion module 60 shown in FIG. 6, a metal layer 61 may be formed on a surface of the insulating substrate 21 opposite to a surface where the n-type thermoelectric conversion element 10A and the p-type thermoelectric conversion element 10B are joined to each other. With this configuration, a heat source can be disposed through the metal layer 61, thermal shock on the insulating substrate 21 can be suppressed, and the service life of the insulating substrate 21 can be extended.

Further, the shape of the thermal conductive member is not limited to the shape of the embodiment, and various shapes can be adopted. For example, a star shape in cross-section may be adopted as in a thermal conductive member 121 shown in FIG. 7(a), a polygonal shape in cross-section may be adopted as in a thermal conductive member 221 shown in FIG. 7(b), a multistage shape in cross-section may be adopted as in a thermal conductive member 321 shown in FIG. 7(c), or a fin 421A may protrude in order to increase the surface area as in a thermal conductive member 421 shown in FIG. 7(d).

Figure 7:
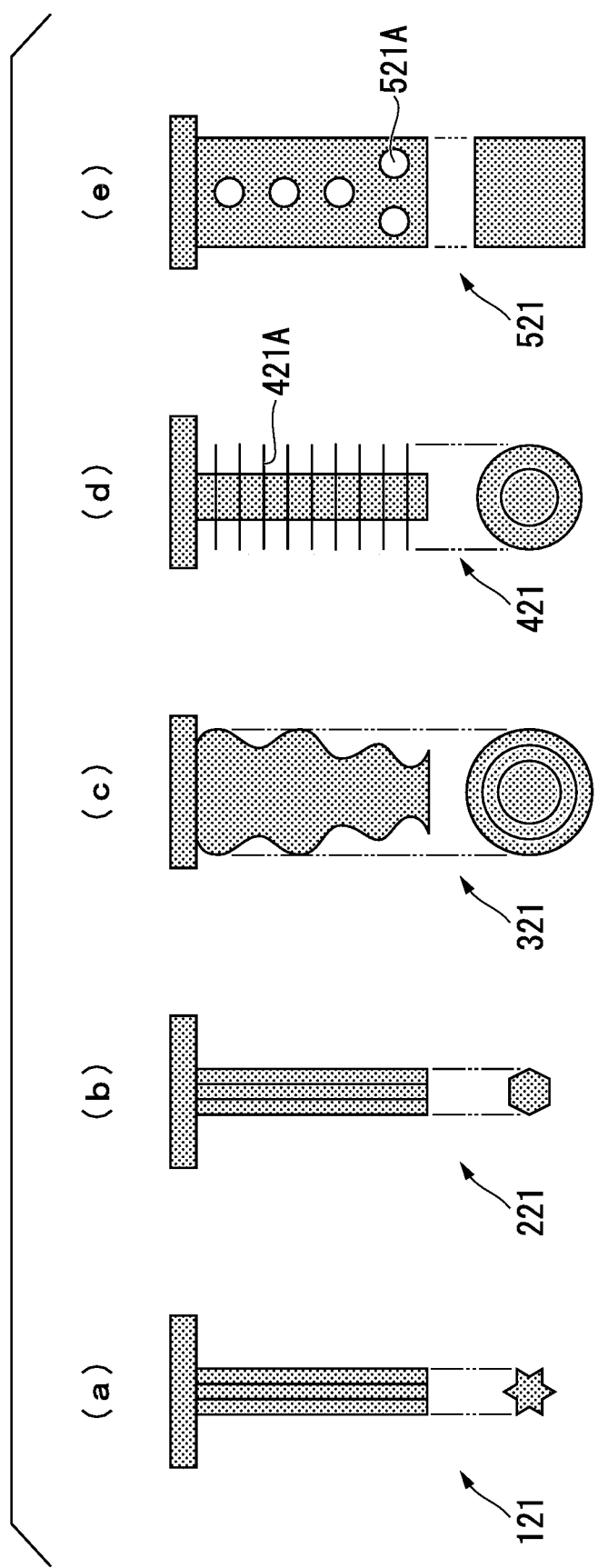
FIG. 7 is a diagram illustrating another example of the thermal conductive member according to the embodiment of the present invention.

Alternatively, as in a thermal conductive member 521 shown in FIG. 7(e), through holes 521A may be provided such that a cooling medium circulates through the through holes 521A. In addition, the thermal conductive member may be formed of a porous metal material.

INDUSTRIAL APPLICABILITY

With the thermoelectric conversion module according to the present invention, the peeling of the thermoelectric conversion element from the substrate or the cracking of the thermoelectric conversion element can be prevented. The thermoelectric conversion module according to the present invention is suitable for a thermoelectric conversion module including a combination of an n-type thermoelectric conversion element and a p-type thermoelectric conversion element that are formed using thermoelectric conversion materials having different thermal expansion coefficients, respectively.

REFERENCE SIGNS LIST

10A: N-TYPE THERMOELECTRIC CONVERSION ELEMENT
10B: P-TYPE THERMOELECTRIC CONVERSION ELEMENT
11A: N-TYPE THERMOELECTRIC CONVERSION MATERIAL
11B: P-TYPE THERMOELECTRIC CONVERSION MATERIAL
12a, 12b: METALIZED LAYER
13a, 13b: ELECTRODE PLATE
22, 121, 221, 321, 421, 521: THERMAL CONDUCTIVE MEMBER

The invention claimed is:

1. A thermoelectric conversion module comprising:
n-type thermoelectric conversion elements and p-type thermoelectric conversion elements, each of which is alternately connected in series through an electrode plate,
wherein the n-type thermoelectric conversion elements and the p-type thermoelectric conversion elements are formed of materials having different thermal expansion coefficients,
each of the n-type thermoelectric conversion elements has a first surface side and a second surface side, and each of the p-type thermoelectric conversion elements has a first surface side and a second surface side,
the first surface side of each of the n-type thermoelectric conversion elements and the first surface side of each of the p-type thermoelectric conversion elements are aligned and joined on one surface side of an insulating substrate, and
each of the second surface side of each of the n-type thermoelectric conversion elements has an independent thermal conductive member, and each of the second surface side of each of the p-type thermoelectric conversion elements has an independent thermal conductive member.

2. The thermoelectric conversion module according to claim 1, wherein a thermal conductive insulating layer is disposed between the each of the second surface sides of the n-type thermoelectric conversion elements and each of the thermal conductive members; and between the each of the second surface sides of the p-type thermoelectric conversion elements and each of the thermal conductive members, respectively.

3. The thermoelectric conversion module according to claim 1, wherein a heat shielding member is further disposed between one of the n-type thermoelectric conversion elements and one of the p-type thermoelectric conversion elements adjacent to each other.

4. The thermoelectric conversion module according to claim 3, wherein the heat shielding member is a heat shielding plate including a plurality of openings that are formed so as to allow penetration of the n-type thermoelectric conversion elements and the p-type thermoelectric conversion elements.

5. The thermoelectric conversion module according to claim 1, wherein a protective cover is formed so as to surround other surface side of the insulating substrate and a circumference of a region in which the n-type thermoelectric conversion elements and the p-type thermoelectric conversion elements are arranged.

6. The thermoelectric conversion module according to claim 1, wherein the thermal conductive member is formed of a material having a thermal conductivity of 10 W/(mK) or more.

7. The thermoelectric conversion module according to claim 1, wherein tip portions of the thermal conductive members that are formed on the second surface surface sides of the n-type thermoelectric conversion elements and the second surface surface sides of the p-type thermoelectric conversion elements are dipped in a coolant.

8. The thermoelectric conversion module according to claim 1, wherein a metal layer is formed on a surface of the insulating substrate opposite to a surface where the n-type thermoelectric conversion elements and the p-type thermoelectric conversion elements are joined to each other.

9. The thermoelectric conversion module according to claim 1, wherein the thermal conductive member is formed of an insulating material having a thermal conductivity of 10 W/(mK) or more.

10. The thermoelectric conversion module according to claim 1, wherein the thermal conductive member is formed of one of silicon carbide, silicon nitride, aluminum nitride, and aluminum oxide.

11. The thermoelectric conversion module according to claim 1, wherein the thermal conductive member is formed of a rod material or a plate material.

\* \* \* \* \*